US011081573B2

(12) United States Patent
Kurokawa et al.

(10) Patent No.: US 11,081,573 B2
(45) Date of Patent: Aug. 3, 2021

(54) SEMICONDUCTOR ELEMENT (71) Applicant: Murata Manufacturing Co., Ltd., Kyoto-fu (JP)

(72) Inventors: Atsushi Kurokawa, Nagaokakyo (JP); Kazuya Kobayashi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 9 days.

(21) Appl. No.: 16/752,560

(22) Filed: Jan. 24, 2020

(65) Prior Publication Data

US 2020/0243671 A1   Jul. 30, 2020

(30) Foreign Application Priority Data

Jan. 28, 2019  (JP) .............................. JP2019-012383

(51) Int. Cl.
| *H01L 21/00* | (2006.01) |
| *H01L 29/732* | (2006.01) |
| *H01L 29/10* | (2006.01) |
| *H01L 29/08* | (2006.01) |
| *H01L 29/417* | (2006.01) |

(Continued)

(52) U.S. Cl.
CPC ............ *H01L 29/732* (2013.01); *H01L 24/05* (2013.01); *H01L 24/13* (2013.01); *H01L 29/0817* (2013.01); *H01L 29/0821* (2013.01); *H01L 29/1004* (2013.01); *H01L 29/205* (2013.01); *H01L 29/41708* (2013.01); *H01L 29/452* (2013.01); *H01L 2224/0401* (2013.01); *H01L 2224/05569* (2013.01); *H01L 2224/05666* (2013.01); *H01L 2224/05684* (2013.01); *H01L 2224/13082* (2013.01); *H01L 2224/13111* (2013.01); *H01L 2224/13139* (2013.01);

(Continued)

(58) Field of Classification Search
CPC ............... H01L 29/732; H01L 29/1004; H01L 29/0817; H01L 29/41708
See application file for complete search history.

(56) References Cited

U.S. PATENT DOCUMENTS 8,685,854 B2 *   4/2014   Ichinose ............... H01L 23/481
                                                              438/672
10,134,842 B2 *  11/2018  Obu ..................... H01L 29/7371

(Continued)

FOREIGN PATENT DOCUMENTS

CN       111490022 A  *  8/2020   ....... H01L 29/42304
JP       2010-251687 A     11/2010

(Continued)

*Primary Examiner* — Laura M Menz
(74) *Attorney, Agent, or Firm* — Studebaker & Brackett PC (57) ABSTRACT

A semiconductor element includes a semiconductor substrate; a collector layer on the semiconductor substrate; a base layer on the collector layer; an emitter layer on the base layer; emitter wiring electrically coupled to the emitter layer; a top metal layer on the emitter wiring; a first protective film covering the emitter wiring and the top metal layer, the first protective film having a first opening that overlaps at least the collector layer; and a bump including an under-bump metal layer electrically coupled to the emitter wiring via the first opening, the under-bump metal layer being larger than the first opening in plan-view area. The first protective film has an inner edge around the first opening, and the inner edge is on the top metal layer.

20 Claims, 7 Drawing Sheets

(51) Int. Cl.
  H01L 23/00     (2006.01)
  H01L 29/205    (2006.01)
  H01L 29/45     (2006.01)
(52) U.S. Cl.
  CPC .............. *H01L 2224/13147* (2013.01); *H01L 2924/014* (2013.01); *H01L 2924/13051* (2013.01)

(56) References Cited

U.S. PATENT DOCUMENTS

| | | | |
|---|---|---|---|
| 10,388,623 B2* | 8/2019 | Umemoto | H01L 29/41708 |
| 10,777,667 B2* | 9/2020 | Kurokawa | H01L 29/41708 |
| 10,903,343 B2* | 1/2021 | Kurokawa | H01L 23/522 |
| 2011/0221063 A1* | 9/2011 | Ichinose | H01L 23/481 257/751 |
| 2017/0243939 A1* | 8/2017 | Obu | H01L 27/0823 |
| 2018/0233475 A1* | 8/2018 | Umemoto | H01L 29/7371 |
| 2020/0168725 A1* | 5/2020 | Kurokawa | H01L 29/66318 |
| 2020/0168726 A1* | 5/2020 | Kurokawa | H01L 29/737 |
| 2020/0235026 A1* | 7/2020 | Kurokawa | H01L 29/0813 |
| 2020/0243671 A1* | 7/2020 | Kurokawa | H01L 29/0821 |

FOREIGN PATENT DOCUMENTS

| | | |
|---|---|---|
| JP | 2010-267944 A | 11/2010 |
| WO | 2015/104967 A1 | 7/2015 |

\* cited by examiner

SEMICONDUCTOR ELEMENT

CROSS-REFERENCE TO RELATED APPLICATION

This application claims benefit of priority to Japanese Patent Application No. 2019-012383, filed Jan. 28, 2019, the entire content of which is incorporated herein by reference.

BACKGROUND

Technical Field

The present disclosure relates to a semiconductor element.

Background Art

International Publication No. 2015/104967 describes a semiconductor device that includes a heterojunction bipolar transistor. The semiconductor device has an emitter layer of the bipolar transistor, emitter wiring, a protective layer, and a bump with solder. The emitter wiring is coupled to the emitter layer, and the protective layer is formed to cover the emitter wiring. The protective layer has an opening that overlaps the emitter layer. An under-bump metal layer (UBM) of the bump is on the protective layer and is electrically coupled to the emitter wiring via the opening. The structure disclosed in International Publication No. 2015/104967 includes a region in which the UBM and the protective layer adhere firmly to each other, and this region of firm adhesion helps prevent the ingress of water.

However, once the solder melts in the semiconductor device according to International Publication No. 2015/104967, for example as a result of heating during the mounting of the device, the molten solder can penetrate between a metal post and the UBM. Unfortunately, the UBM may have been formed with a space therein or too thin at the opening edge of the protective film because of a height difference there. Once solder penetrates between the metal post and the UBM, this space in or thin portion of the UBM can provide a pathway for the solder to enter the emitter wiring. Solder entering into the emitter wiring can affect the reliability of the semiconductor device.

SUMMARY

Accordingly, the present disclosure provides a semiconductor element that offers improved reliability by virtue of hindered penetration of solder into a transistor.

According to preferred embodiments of the present disclosure, a semiconductor element has a semiconductor substrate; a collector layer on the semiconductor substrate; a base layer on the collector layer; an emitter layer on the base layer; emitter wiring electrically coupled to the emitter layer; a top metal layer on the emitter wiring; a first protective film covering the emitter wiring and the top metal layer, the first protective film having a first opening that overlaps at least the collector layer; and a bump including an under-bump metal layer electrically coupled to the emitter wiring via the first opening. The under-bump metal layer is larger than the first opening in plan-view area. The first protective film has an inner edge around the first opening, and the inner edge is on the top metal layer.

In this structure, a top metal layer overlaps at least the inner edge of the first protective film. Even if the under-bump metal layer has a space therein or is too thin at the point of a height difference between the first protective film and the emitter wiring, the top metal layer blocks solder from penetrating into the transistor. By virtue of this, the semiconductor element offers improved reliability.

Semiconductor elements according to preferred embodiments of the present disclosure offer improved reliability by virtue of hindered penetration of solder into a transistor.

Other features, elements, characteristics and advantages of the present disclosure will become more apparent from the following detailed description of preferred embodiments of the present disclosure with reference to the attached drawings.

DETAILED DESCRIPTION

The following describes semiconductor elements according to embodiments of the present disclosure in detail with reference to the drawings. It should be noted that no aspect of the present disclosure is limited to these embodiments. Needless to say, the embodiments presented hereinafter are illustrative, and partial replacement or combination of configurations described in different embodiments is possible. The second and later embodiments skip over anything in common with Embodiment 1 and describe only differences. In particular, similar advantages resulting from similar configurations are not mentioned one by one in each embodiment.

Embodiment 1

Figure 1:
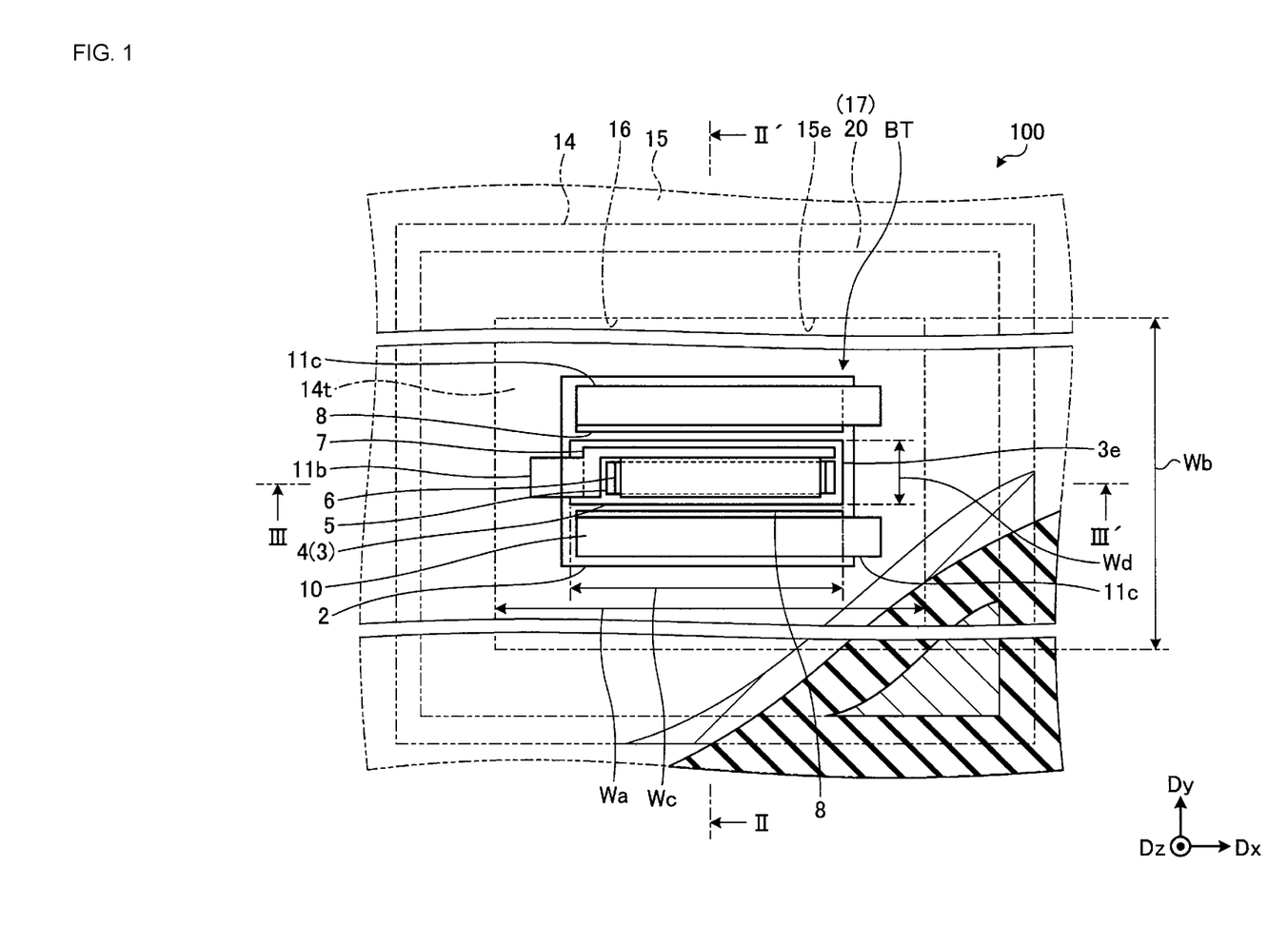
FIG. 1 is a plan view of a semiconductor element according to Embodiment 1.
Figure 2:
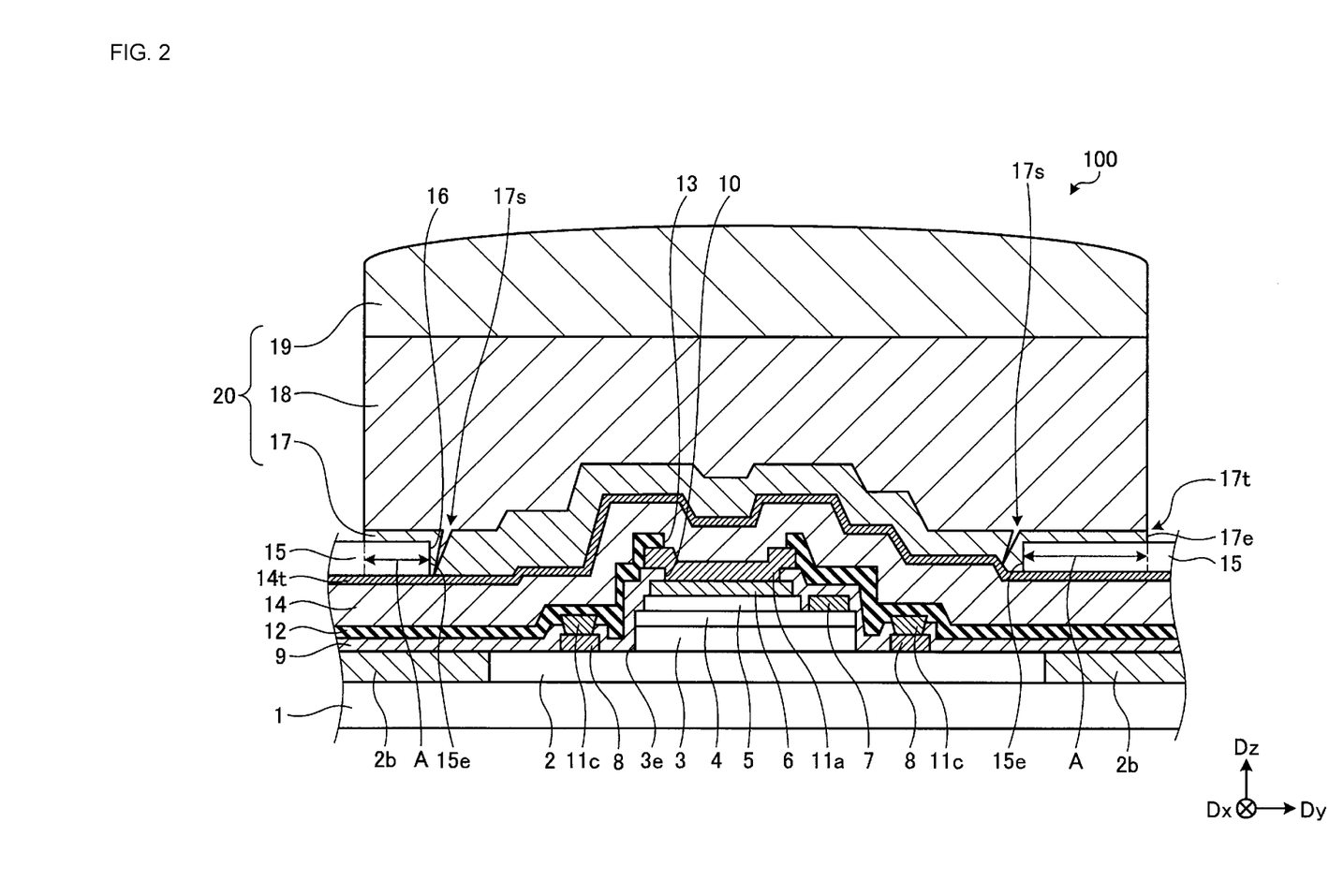
FIG. 2 is a cross-section along line II-II in FIG. 1.
Figure 3:
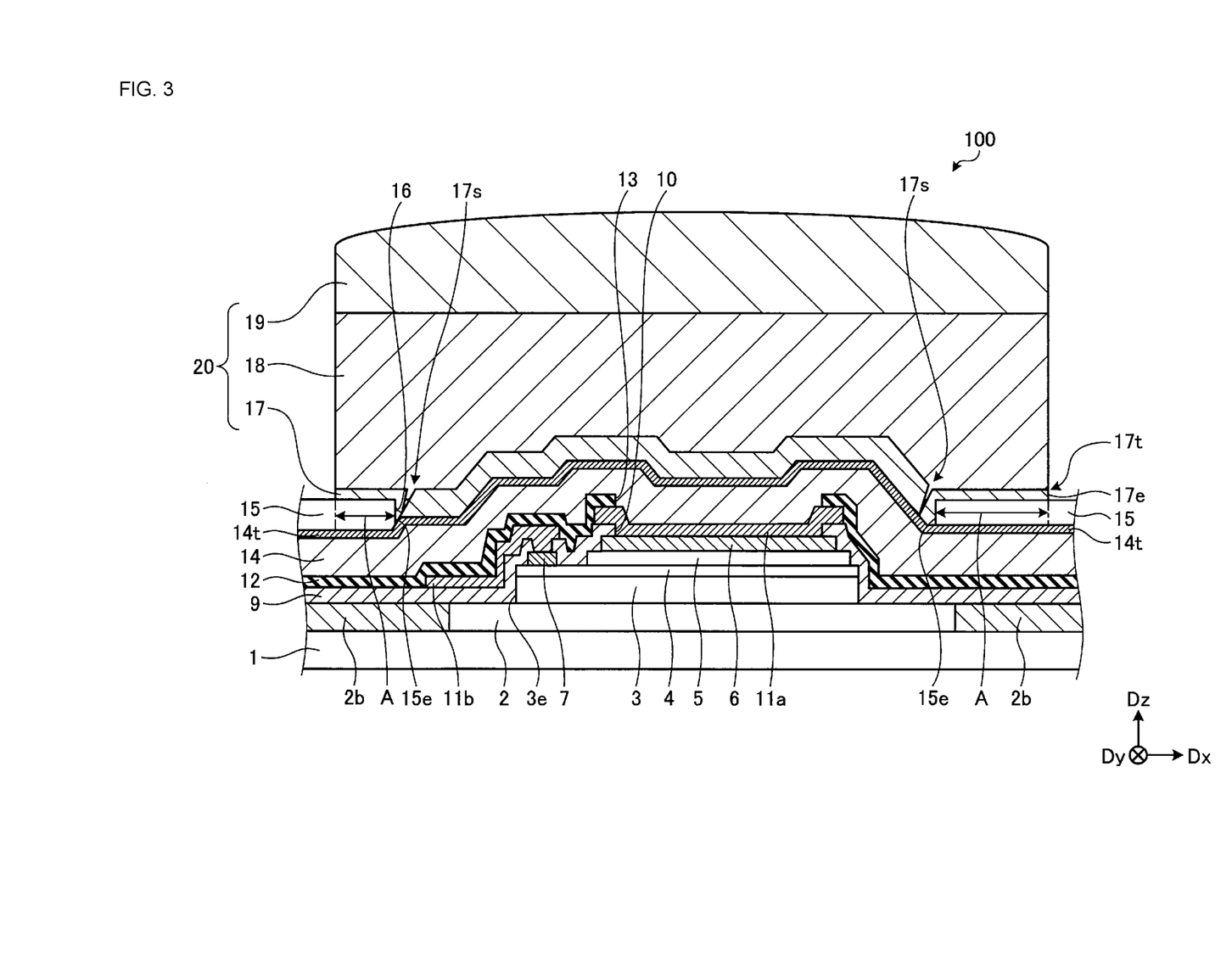
FIG. 3 is a cross-section along line III-III in FIG. 1.

FIG. 1 is a plan view of a semiconductor element according to Embodiment 1. FIG. 2 is a cross-section along line II-II in FIG. 1. FIG. 3 is a cross-section along line III-III in FIG. 1.

As illustrated in FIG. 1, the semiconductor element 100 has a bipolar transistor BT, second wiring 14, a top metal layer 14t, a first protective film 15, and a pillar bump 20. The bipolar transistor BT is a heterojunction bipolar transistor (HBT).

In the following description, a direction in the plane parallel to the surface of the semiconductor substrate 1 (see FIG. 2) is defined as the first direction Dx. The direction perpendicular to the first direction Dx in the plane parallel to the surface of the semiconductor substrate 1 is defined as the second direction Dy. The direction perpendicular to each of the first and second directions Dx and Dy is defined as the third direction Dz. These are not the only possible definitions of directions; for example, the second direction Dy may at an angle other than 90° to the first direction Dx, and the third direction Dz may be at an angle other than 90° to the first and second directions Dx and Dy. As mentioned herein, the positions of things "in plan view" represent those of the things when viewed in the third direction Dz.

The bipolar transistor BT includes a subcollector layer 2, a collector layer 3, a base layer 4, an emitter layer 5, an emitter electrode 6, a base electrode 7, and two collector electrodes 8. The collector, base, and emitter layers 3, 4, and 5 are on the subcollector layer 2. Each of the collector, base, and emitter layers 3, 4, and 5 is substantially rectangular, longer in the first direction Dx. In the second direction Dy, the collector, base, and emitter layers 3, 4 and 5 are between the two collector electrodes 8.

As illustrated in FIGS. 2 and 3, the semiconductor element 100 has a stack of layers on the semiconductor substrate 1 in which the subcollector layer 2, the collector layer 3, the base layer 4, the emitter layer 5, the emitter electrode 6, a line of first wiring 11a, the second wiring 14 (emitter wiring), and the top metal layer 14t are stacked in this order. The first protective film 15 covers the second wiring 14 and the top metal layer 14t and has a first opening 16 that overlaps at least the collector layer 3. The pillar bump 20 is on the first protective film 15 and is electrically coupled to the second wiring 14 and the top metal layer 14t via the first opening 16.

More specifically, the semiconductor substrate 1 is, for example, a semi-insulating GaAs (gallium arsenide) substrate. The subcollector layer 2, lying on the semiconductor substrate 1, is a heavily doped n-type GaAs layer with a thickness of, for example, about 0.5 μm. The collector layer 3, lying on the subcollector layer 2, is an n-type GaAs layer with a thickness of, for example, about 1 μm. The base layer 4, lying on the collector layer 3, is a p-type GaAs layer with a thickness of, for example, about 100 nm.

The emitter layer 5, lying on the base layer 4, includes an intrinsic emitter layer closer to the base layer 4 and an emitter mesa layer on the intrinsic emitter layer. The intrinsic emitter layer is an n-type InGaP (indium gallium phosphide) layer with a thickness of, for example, about 30 nm or more and about 40 nm or less (i.e., from about 30 nm to about 40 nm). The emitter mesa layer is formed by a heavily doped n-type GaAs layer and a heavily doped n-type InGaAs layer. Each of the heavily doped n-type GaAs and heavily doped n-type InGaAs layers is, for example, about 100 nm thick. The heavily doped n-type InGaAs layer of the emitter mesa layer is for establishing an ohmic contact with the emitter electrode 6.

As illustrated in FIG. 2, the collector electrodes 8 are on the subcollector layer 2, touching the subcollector layer 2. The collector electrodes 8 have a multilayer film, for example composed of a AuGe (gold germanium) film, a Ni (nickel) film, and a Au (gold) film stacked in this order. The AuGe film is, for example, about 60 nm thick, the Ni film is, for example, about 10 nm thick, and the Au film is, for example, about 200 nm thick.

The base electrode 7 is on the base layer 4, touching the base layer 4. The base electrode 7 is a multilayer film composed of a Ti film, a Pt film, and a Au film stacked in this order. The Ti film is, for example, about 50 nm thick, the Pt film is, for example, about 50 nm thick, and the Au film is, for example, about 200 nm thick.

The emitter electrode 6 is on the emitter mesa layer of the emitter layer 5, touching the emitter mesa layer. The emitter electrode 6 is a Ti (titanium) film. The Ti film is, for example, about 50 nm thick.

The semiconductor element 100 also has an isolation region 2b adjacent to the subcollector layer 2 on the semiconductor substrate 1. The isolation region 2b has been made insulating by ion implantation. The isolation region 2b electrically isolates elements (multiple bipolar transistors BT) from one another.

On the subcollector layer 2 and isolation region 2b is a first insulating film 9, covering the emitter, base, and collector electrodes 6, 7, and 8. The first insulating film 9 is, for example, a SiN (silicon nitride) film. The first insulating film 9 may be a single layer or may be a stack of multiple nitride or oxide layers. Alternatively, the first insulating film 9 may have a multilayer structure composed of a SiN layer and a resin layer.

On the first insulating film 9 are lines of first wiring 11a, 11b, and 11c. The first wiring 11b is not illustrated in FIG. 2, and the first wiring 11c is not illustrated in FIG. 3. The first insulating film 9 has a first-insulating-film opening 10, and the first wiring 11a is coupled to the emitter electrode 6 via the first-insulating-film opening 10. Likewise, the lines of first wiring 11b and 11c are coupled to the base and collector electrodes 7 and 8, respectively, via openings in the first insulating film 9.

Each line of first wiring 11a, 11b, and 11c is, for example, a Ti film/Au film. The Ti film has a thickness of about 10 nm or more and about 50 nm or less (i.e., from about 10 nm to about 50 nm), and the Au film has a thickness of about 1 μm or more and about 2 μm or less (i.e., from about 1 μm to about 2 μm). The symbol "/" represents a layered structure. For example, Ti/Au represents a structure in which Au is on Ti.

There is also a second insulating film 12 on the first insulating film 9, covering the multiple lines of first wiring 11a, 11b, and 11c. Materials that can be used for the second insulating film 12 are the same as those for the first insulating film 9. The second insulating film 12 may be, for example, a single-layer film that is a SiN layer or may have a multilayer structure composed of a SiN layer and a resin layer. The second insulating film 12 has a second-insulating-film opening 13 that overlaps the first wiring 11a.

The second wiring 14 is on the second insulating film 12 and is coupled to the first wiring 11a via the second-insulating-film opening 13. The second wiring 14 is electrically coupled to the emitter layer 5 via the first wiring 11a. The second wiring 14 is, for example, a Ti film/Au film. The Ti film has a thickness of about 10 nm or more and about 50 nm or less (i.e., from about 10 nm to about 50 nm), and the Au film has a thickness of about 2 μm or more and about 4 μm or less (i.e., from about 2 μm to about 4 μm). The second wiring 14 covers the entire bipolar transistor BT, including the collector, base, and emitter layers 3, 4, and 5.

The top metal layer 14t is on the second wiring 14. The top metal layer 14t covers the entire second wiring 14, or covers the entire bipolar transistor BT, including the collector, base, and emitter layers 3, 4, and 5. The top metal layer 14t contains one or more of W (tungsten), Ti (titanium), Mo (molybdenum), Ta (tantalum), Ni (nickel), and Cr (chromium) metals. The top metal layer 14t can be a layer of a compound that contains one or more of these metals or may be a layer of an alloy that contains one or more of these metals. The thickness of the top metal layer 14t is, for example, about 50 nm or more and about 2 μm or less (i.e., from about 50 nm to about 2 μm).

Specific examples of top metal layers 14t include a single-layer film that is primarily any of W, Ti, Mo, Ta, Ni, and Cr; a layer of an alloy, such as TiW; a layer of a silicide, such as TiSi, WSi, or TaSi; and a layer of a nitride, such as TaN, WN, or TiN. Alternatively, the top metal layer 14t may be a stack of layers of these metals or may have a multilayer structure like Ni/TiW.

The first protective film 15 covers the second wiring 14 and the top metal layer 14t. In other words, the top metal layer 14t is between the second wiring 14 and the first protective film 15 in the direction perpendicular to the semiconductor substrate 1 (third direction Dz). The first protective film 15 is, for example, an inorganic insulating film that contains at least one of SiN and SiON (silicon oxynitride).

The first protective film 15 has a first opening 16 that overlaps at least the collector layer 3. The top metal layer 14t is exposed, or not covered by the first protective film 15, inside the edge of the first opening 16. In other words, the first protective film 15 has an inner edge 15e around the first opening 16, and this inner edge 15e is on the top metal layer 14t. Although the top metal layer 14t in this embodiment extends continuously to overlap the first protective film 15 and the entire first opening 16, the top metal layer 14t works as long as it overlaps at least the periphery of the first opening 16 (inner edge 15e of the first protective film 15).

The pillar bump 20 fills the first opening 16, touching the portion of the first protective film 15 surrounding the first opening 16. As illustrated in FIGS. 2 and 3, the pillar bump 20 has a multilayer structure composed of an under-bump metal layer 17 (UBM), a metal post 18, and solder 19. The UBM 17 touches the top metal layer 14t inside the edge of the first opening 16 and is coupled to the second wiring 14 via the top metal layer 14t. The UBM 17, moreover, touches the top surface and inner edge 15e of the first protective film 15 around the periphery of the first opening 16.

The UBM 17 is a layer of, for example, Ti or TiW and has a thickness of about 50 nm or more and about 200 nm or less (i.e., from about 50 nm to about 200 nm). The metal post 18 is made of, for example, Cu and has a thickness of about 10 μm or more and about 50 μm or less (i.e., from about 10 μm to about 50 μm). The solder 19 is a piece of, for example, Sn or Sn—Ag alloy and has a thickness of about 10 μm or more and about 30 μm or less (i.e., from about 10 μm to about 30 μm).

As illustrated in FIG. 1, the first opening 16, created in the first protective film 15, occupies a larger area than the collector layer 3 of the bipolar transistor BT. That is, the collector, base, and emitter layers 3, 4, and 5 are inside the inner edge 15e of the first protective film 15. The width Wa in the first direction Dx of the first opening 16 is larger than the width Wc in the first direction Dx of the collector layer 3, and the width Wb in the second direction Dy of the first opening 16 is larger than the width Wd in the second direction Dy of the collector layer 3. It should be noted that the width Wa in the first direction Dx of the first opening 16 is the distance between the opposite ends of the inner edge 15e of the first protective film 15 in the first direction Dx, and the width Wb in the second direction Dy of the first opening 16 is the distance between the opposite ends of the inner edge 15e of the first protective film 15 in the second direction Dy.

The pillar bump 20 is larger than the first opening 16 in plan-view area. To be more specific, the area in plan view of the UBM 17 is larger than that of the first opening 16. That is, the edge of the pillar bump 20, or, more specifically, the outer edge 17e of the UBM 17, is on the first protective film 15.

Overall, as illustrated in FIGS. 2 and 3, the semiconductor element 100 in cross-sectional view has a stack of the second wiring 14, top metal layer 14t, and UBM 17, stacked in this order in the third direction Dz, inside the edge of the first opening 16. Outside the first opening 16, the second wiring 14, top metal layer 14t, first protective film 15, and UBM 17 are stacked in this order in the third direction Dz.

During the mounting of the semiconductor element 100, heating can increase the element's temperature so high that an excess of solder melts. The molten solder runs along the sidewall of the metal post 18, and some can penetrate into the interface 17t between the metal post 18 and the UBM 17 (see FIGS. 2 and 3). The UBM 17 of the pillar bump 20 has been formed to fit the top surface and inner edge 15e of the first protective film 15 and the top surface of the second wiring 14, but there is a difference in height between the first protective film 15 and the second wiring 14. Because of this height difference, the UBM 17 can have a space 17s therein or can be too thin (to an extent that a disconnection is caused) at the periphery of the first opening 16.

The semiconductor element 100 according to this embodiment has a top metal layer 14t between the second wiring 14 and UBM 17, with the top metal layer 14t overlapping at least the periphery of the first opening 16 (inner edge 15e). Even if solder penetrates into a space 17s, for example, in the UBM 17 by spreading through the interface 17t, therefore, the top metal layer 14t blocks the solder from entering the second wiring 14. By blocking in this way solder from diffusing inside the second wiring 14 and finally reaching the emitter layer 5, the semiconductor element 100 prevents damage to and a loss of reliability of the bipolar transistor BT.

Blocking solder from reaching the second wiring 14 also means reducing the chance of electrochemical migration of the metal material(s) contained in the solder, for example Sn and/or Ag, in the second wiring 14. In particular, transistors like power transistors, which are used at high power, enjoy a great reduction of electrochemical migration. This is the way in which the semiconductor element 100 offers improved reliability by virtue of hindered penetration of solder into the bipolar transistor BT.

At the periphery of the first opening 16, moreover, the UBM 17 is on a first protective film 15. The UBM 17, which is a layer of Ti or TiW for example, and the first protective film 15, which is a film of SiN or SiON for example, adhere firmly to each other. By virtue of this region A of firm adhesion between the UBM 17 and the first protective film 15, the semiconductor element 100 also blocks the ingress of water into the bipolar transistor BT.

Embodiment 2

Figure 4:
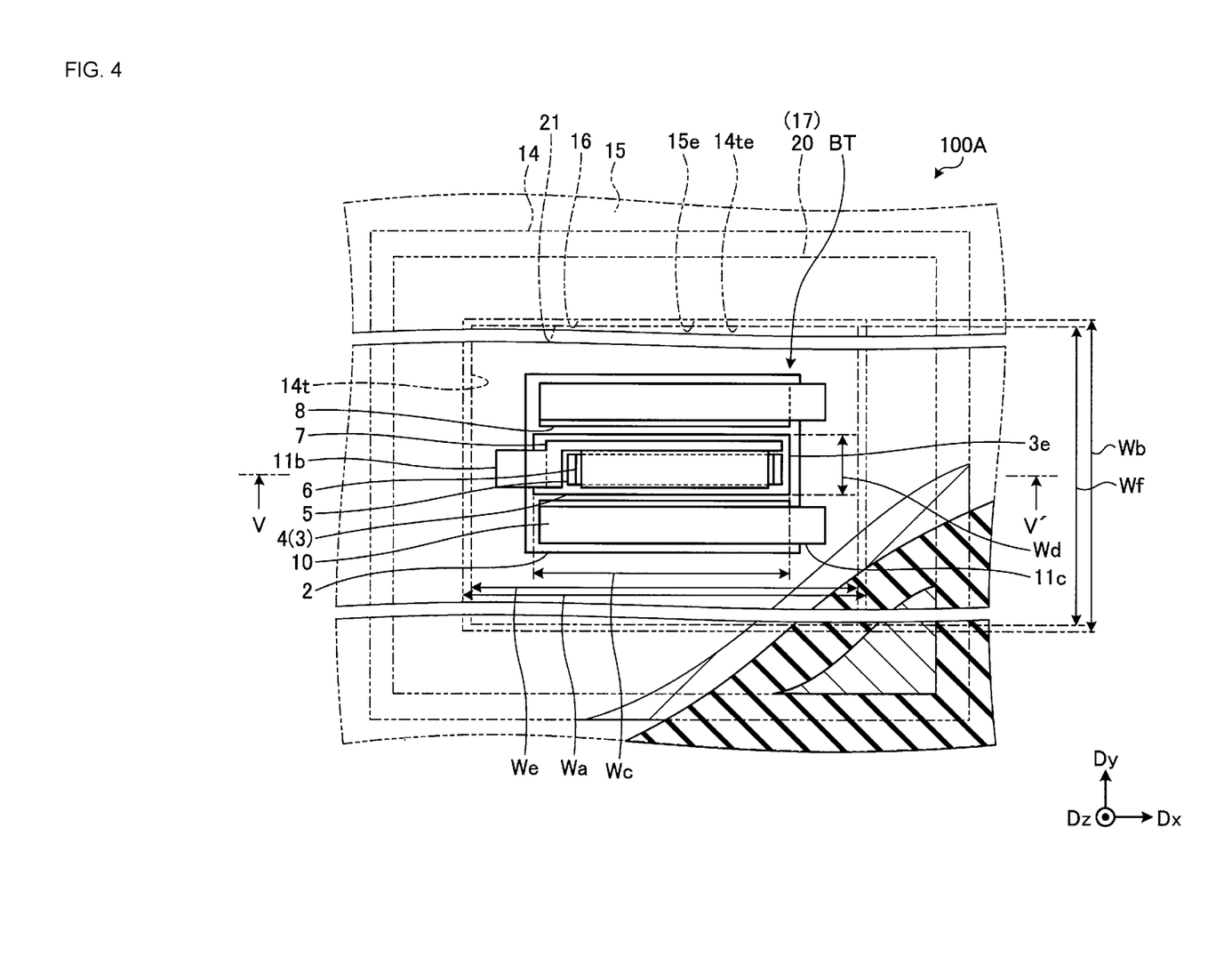
FIG. 4 is a plan view of a semiconductor element according to Embodiment 2.
Figure 5:
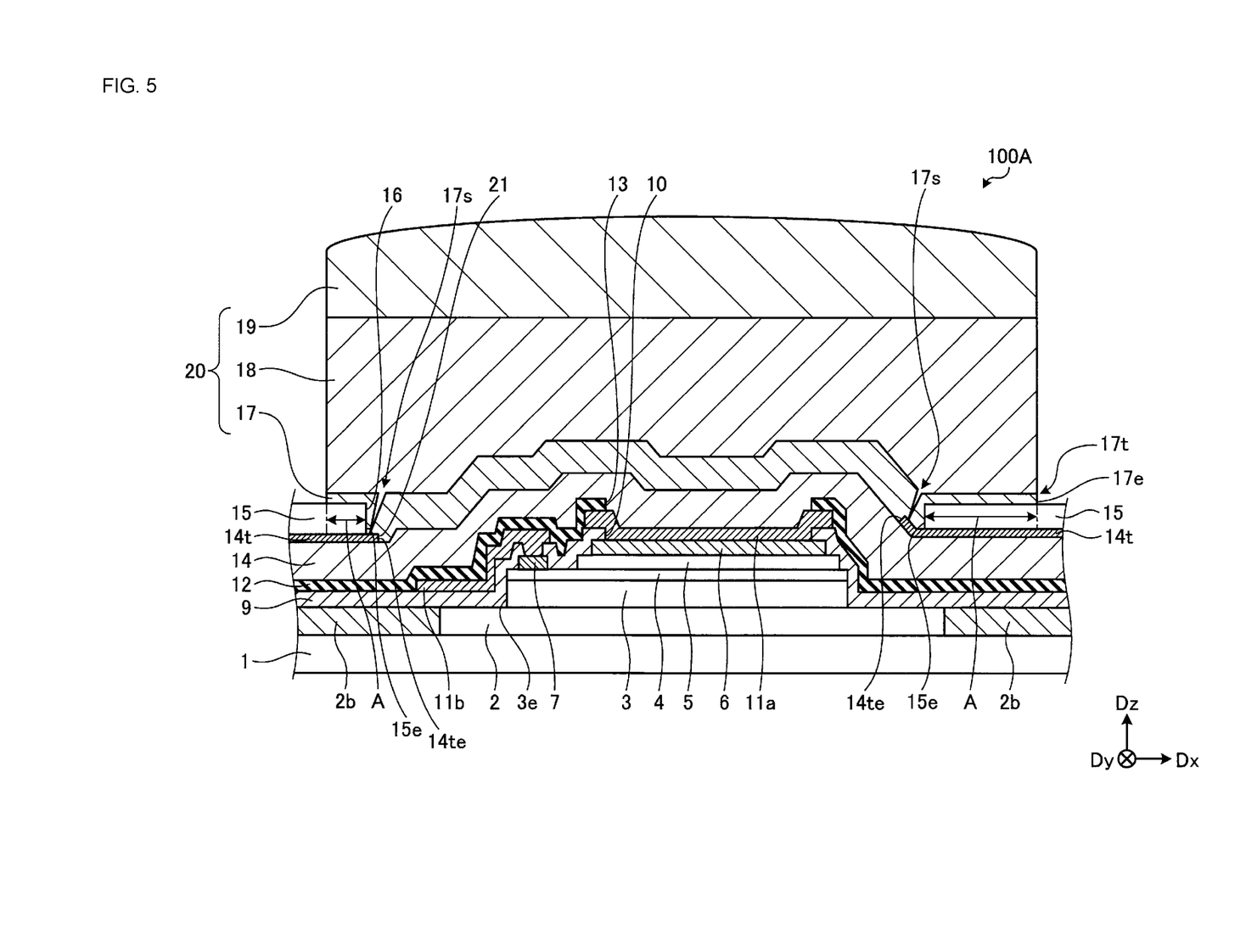
FIG. 5 is a cross-section along line V-V in FIG. 4.

FIG. 4 is a plan view of a semiconductor element according to Embodiment 2. FIG. 5 is a cross-section along line V-V in FIG. 4. In Embodiment 2, unlike Embodiment 1, the top metal layer 14t has a second opening 21.

As illustrated in FIGS. 4 and 5, the top metal layer 14t has a second opening 21 that overlaps the first opening 16, the opening created in the first protective film 15. As illustrated in FIG. 4, the second opening 21 is larger than the collector layer 3 and smaller than the first opening 16 in plan-view area. The top metal layer 14t has an inner edge 14te around the second opening 21, and the inner edge 14te is between the inner edge 15e of the first protective film 15 and the outer edge 3e of the collector layer 3 in plan view.

That is, the width We in the first direction Dx of the second opening 21 is larger than the width Wc in the first direction Dx of the collector layer 3 and smaller than the width Wa in the first direction Dx of the first opening 16, and the width Wf in the second direction Dy of the second opening 21 is larger than the width Wd in the second direction Dy of the collector layer 3 and smaller than the width Wb in the second direction Dy of the first opening 16.

As illustrated in FIG. 5, the second wiring 14 is exposed, or not covered by the top metal layer 14t, inside the edge of the second opening 21. The UBM 17 fills the first and second openings 16 and 21, touching the inner edge 15e of the first protective film 15 and the inner edge 14te of the top metal layer 14t. The UBM 17 is connected directly to the second wiring 14 via the first and second openings 16 and 21.

Preferably, the length of the portion of the top metal layer 14t not covered by the first protective film 15, or the distance in the first direction Dx between the inner edge 15e of the first protective film 15 and the inner edge 14te of the top metal layer 14t, is equal to or longer than the thickness of the first protective film 15. This ensures that the top metal layer 14t sticks out from beneath the inner edge 15e of the first protective film 15. The top metal layer 14t therefore extends to inside the edge of the first opening 16, reaching beneath a space 17s, for example, in the UBM 17 caused by a height difference the first protective film 15 has. This makes the top metal layer 14t effective in blocking the penetration of solder.

Preferably, the top metal layer 14t does not overlap the outer edge 3e of the collector layer 3. This ensures that the direct connection between the UBM 17 and the second wiring 14 is established in the middle of the first opening 16, thereby helping reduce the contact resistance between the second wiring 14 and the UBM 17. This in other words means greater flexibility is allowed in choosing the material (s) for the top metal layer 14t. To be more specific, the manufacturer can use material(s) with high electrical resistance in the top metal layer 14t and/or use readily oxidizable materials in the production of the semiconductor element 100A while achieving low contact resistance between the second wiring 14 and the UBM 17.

Variation

Figure 6:
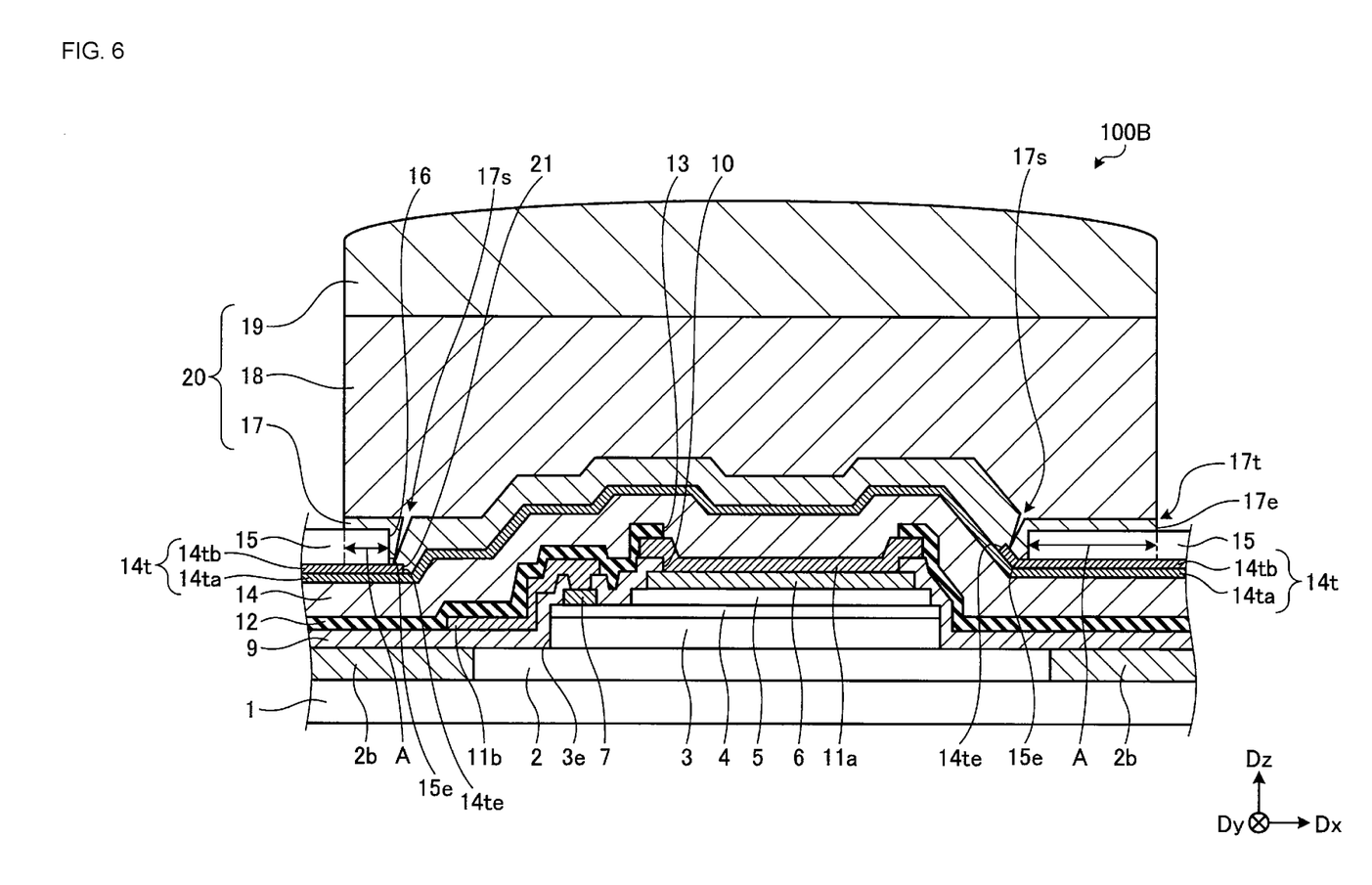
FIG. 6 is a cross-section of a semiconductor element according to a variation of Embodiment 2.

FIG. 6 is a cross-section of a semiconductor element according to a variation of Embodiment 2. As illustrated in FIG. 6, a semiconductor element 100B according to a variation may have a multilayer-structured top metal layer 14t composed of a first metal layer 14ta and a second metal layer 14tb. The first metal layer 14ta extends continuously to overlap the first protective film 15 and the first opening 16. The first metal layer 14ta is, for example, a Ni film. The second metal layer 14tb is on the first metal layer 14ta. The second metal layer 14tb is a TiW or Ti film. In this variation, the second opening 21 is only in the second metal layer 14tb. That is, it may be that the top metal layer 14t has the multilayer structure of Ni/TiW or Ni/Ti at the periphery of the first opening 16 and is a single layer of Ni film in the middle of the first opening 16.

In this configuration, the first metal layer 14ta gives the semiconductor element 100B a barrier against solder penetrating through a space 17s, for example, in the UBM 17 that occurs in the middle of the first opening 16 because of a difference in height the collector layer 3 creates. In region A, moreover, the TiW or Ti film as the second metal layer 14tb comes into contact with the first protective film 15, improving the adhesion between the second metal layer 14tb and the first protective film 15 from that with a single layer of Ni film alone. By virtue of this ability to block the ingress of water, the semiconductor element 100B is also highly resistant to moisture.

Embodiment 3

Figure 7:
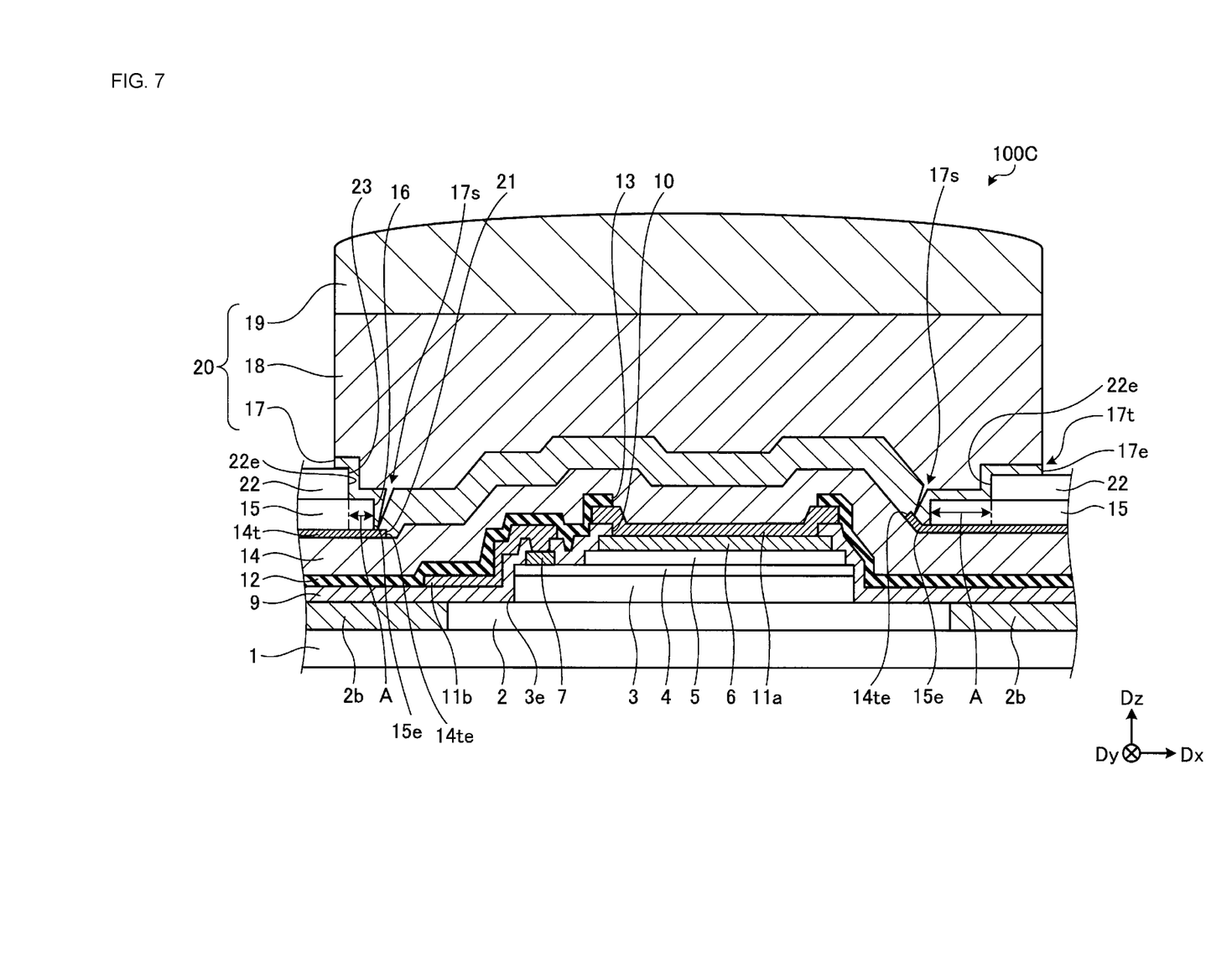
FIG. 7 is a cross-section of a semiconductor element according to Embodiment 3.

FIG. 7 is a cross-section of a semiconductor element according to Embodiment 3. In Embodiment 3, unlike Embodiment 2, there is a second protective film 22 on the first protective film 15.

As illustrated in FIG. 7, a semiconductor element 100C according to Embodiment 3 includes a second protective film 22 that has a third opening 23 that overlaps the first and second openings 16 and 21. The UBM 17 fills the first, second, and third openings 16, 21, and 23, touching the inner edge 14te of the top metal layer 14t, the inner edge 15e of the first protective film 15, and the inner edge 22e of the second protective film 22, each of which is at the periphery of the opening in the layer or film. The UBM 17 is connected directly to the second wiring 14 via the first, second, and third openings 16, 21, and 23.

The third opening 23 is larger than the first and second openings 16 and 21 in plan-view area. In other words, the inner edge 22e of the second protective film 22 is on the first protective film 15. The pillar bump 20, moreover, is larger than the third opening 23 in plan-view area. The edge of the pillar bump 20, or, more specifically, the outer edge 17e of the UBM 17, is on the second protective film 22.

The second protective film 22 is a resin film, for example a film of polyimide. The second protective film 22 is more permeable to water than is the first protective film 15, which is a film of inorganic insulating material. This embodiment also has region A, a region in which the UBM 17 and the first protective film 15 come into contact with each other, inside the inner edge 22e of the second protective film 22. Region A is outside the first opening 16. By virtue of the resulting ability to block the ingress of water, the semiconductor element 100C is highly resistant to moisture despite the use of a second protective film 22.

The outer edge 17e of the UBM 17, furthermore, is on the second protective film 22. The second protective film 22 therefore relaxes stress that occurs in the pillar bump 20 and the bipolar transistor BT. By virtue of this, the semiconductor element 100C is highly resistant to mechanical stress.

The configuration of Embodiment 3 can also be applied to the semiconductor elements 100 and 100B described in Embodiment 1 and the variation.

Although the semiconductor elements set forth in the above embodiments have one bipolar transistor BT, the described configurations also work with a semiconductor element that has multiple bipolar transistors BT on a semiconductor substrate 1. The bump, moreover, does not need to be a pillar bump 20. Besides a pillar bump 20, it can be, for example, a solder bump or stud bump.

The details of structural components given in the above embodiments, such as materials, thicknesses, and dimensions, are merely examples and can be changed. For example, the top metal layer 14t may be formed thicker or as a stack of multiple metal layers depending on the risk of solder penetration, for example estimated from the conditions of the heating process in the mounting of the semiconductor element 100 and the environment in which the element will be used. The material(s) for and thickness of the subcollector layer 2, collector layer 3, base layer 4, emitter layer 5, and lines of wiring can also be changed. Furthermore, the shape in plan view of the emitter layer 5, substantially rectangular in the above embodiments, may alternatively be substantially round, substantially oval, substantially hexagonal, or substantially octagonal, for example.

The above embodiments are given to help understand the present disclosure and are not to be construed as limiting the present disclosure. The present disclosure can be modified and/or improved without departing from its spirit and encompasses its equivalents.

While preferred embodiments of the disclosure have been described above, it is to be understood that variations and modifications will be apparent to those skilled in the art without departing from the scope and spirit of the disclosure.

The scope of the disclosure, therefore, is to be determined solely by the following claims.

What is claimed is:

1. A semiconductor element comprising:
   a semiconductor substrate;
   a collector layer on the semiconductor substrate;
   a base layer on the collector layer;
   an emitter layer on the base layer;
   emitter wiring electrically coupled to the emitter layer;
   a top metal layer on the emitter wiring;
   a first protective film covering the emitter wiring and the top metal layer, the first protective film having a first opening that overlaps at least the collector layer, the first protective film having an inner edge around the first opening, and the inner edge being on the top metal layer; and
   a bump including an under-bump metal layer electrically coupled to the emitter wiring via the first opening, the under-bump metal layer being larger than the first opening in plan-view area.

2. The semiconductor element according to claim 1, wherein:
   the top metal layer extends to overlap the first protective film and the first opening; and
   the under-bump metal layer is coupled to the emitter wiring via the top metal layer.

3. The semiconductor element according to claim 1, wherein:
   the top metal layer has a second opening that overlaps the first opening; and
   the under-bump metal layer is connected directly to the emitter wiring via the first and second openings.

4. The semiconductor element according to claim 3, wherein
   the top metal layer has an inner edge around the second opening, and the inner edge of the top metal layer is between the inner edge of the first protective film and an outer edge of the collector layer in plan view.

5. The semiconductor element according to claim 1, wherein
   the under-bump metal layer touches a top surface of the first protective film outside the first opening.

6. The semiconductor element according to claim 1, further comprising
   a second protective film on the first protective film.

7. The semiconductor element according to claim 1, wherein
   the top metal layer contains one or more of tungsten, titanium, molybdenum, tantalum, nickel, and chromium metals or has a compound containing one or more of the metals or an alloy containing one or more of the metals.

8. The semiconductor element according to claim 1, wherein
   the first protective film is an inorganic insulating film containing at least one of silicon nitride and silicon oxynitride.

9. The semiconductor element according to claim 2, wherein
   the under-bump metal layer touches a top surface of the first protective film outside the first opening.

10. The semiconductor element according to claim 3, wherein
    the under-bump metal layer touches a top surface of the first protective film outside the first opening.

11. The semiconductor element according to claim 4, wherein
    the under-bump metal layer touches a top surface of the first protective film outside the first opening.

12. The semiconductor element according to claim 2, further comprising
    a second protective film on the first protective film.

13. The semiconductor element according to claim 3, further comprising
    a second protective film on the first protective film.

14. The semiconductor element according to claim 4, further comprising
    a second protective film on the first protective film.

15. The semiconductor element according to claim 5, further comprising
    a second protective film on the first protective film.

16. The semiconductor element according to claim 2, wherein
    the top metal layer contains one or more of tungsten, titanium, molybdenum, tantalum, nickel, and chromium metals or has a compound containing one or more of the metals or an alloy containing one or more of the metals.

17. The semiconductor element according to claim 3, wherein
    the top metal layer contains one or more of tungsten, titanium, molybdenum, tantalum, nickel, and chromium metals or has a compound containing one or more of the metals or an alloy containing one or more of the metals.

18. The semiconductor element according to claim 4, wherein
    the top metal layer contains one or more of tungsten, titanium, molybdenum, tantalum, nickel, and chromium metals or has a compound containing one or more of the metals or an alloy containing one or more of the metals.

19. The semiconductor element according to claim 2, wherein
    the first protective film is an inorganic insulating film containing at least one of silicon nitride and silicon oxynitride.

20. The semiconductor element according to claim 3, wherein
    the first protective film is an inorganic insulating film containing at least one of silicon nitride and silicon oxynitride.

* * * * *